United States Patent
Xu et al.

(10) Patent No.: US 8,816,647 B2
(45) Date of Patent: Aug. 26, 2014

(54) BATTERY HEATING CIRCUITS AND METHODS USING RESONANCE COMPONENTS IN SERIES BASED ON CURRENT LIMITING AND VOLTAGE INVERSION WITH BI-DIRECTIONALITY

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 283 days.

(21) Appl. No.: 13/166,301

(22) Filed: Jun. 22, 2011

(65) Prior Publication Data

US 2012/0025775 A1    Feb. 2, 2012

(30) Foreign Application Priority Data

Jul. 30, 2010   (CN) .......................... 2010 1 0245288
Aug. 30, 2010   (CN) .......................... 2010 1 0274785
Dec. 23, 2010   (CN) .......................... 2010 1 0603471

(51) Int. Cl.
   *H01M 10/46*   (2006.01)
(52) U.S. Cl.
   USPC .................................................. 320/150
(58) Field of Classification Search
   USPC ........................................ 320/128, 129, 150
   See application file for complete search history.

(56) References Cited

U.S. PATENT DOCUMENTS

| 3,654,426 | A |   | 4/1972  | Brinkmann et al. |
| 3,808,481 | A |   | 4/1974  | Rippel |
| 4,171,508 | A |   | 10/1979 | Sinclair |
| 4,184,197 | A |   | 1/1980  | Cuk et al. |
| 4,222,000 | A |   | 9/1980  | Silvertown et al. |
| 5,362,942 | A |   | 11/1994 | Vanderslice, Jr. et al. |
| 5,396,165 | A | * | 3/1995  | Hwang et al. ................. 323/210 |
| 5,461,556 | A |   | 10/1995 | Horie et al. |
| 5,768,114 | A |   | 6/1998  | Gruning et al. |
| 5,789,905 | A | * | 8/1998  | Yamasaki .................... 323/222 |
| 5,808,469 | A |   | 9/1998  | Kopera |

(Continued)

FOREIGN PATENT DOCUMENTS

| CN | 1630129 A | 6/2005 |
| CN | 1630130 A | 6/2005 |

(Continued)

OTHER PUBLICATIONS

China Patent Office, Office Action dated Sep. 21, 2011, in related application CN 201010603658.3.

(Continued)

*Primary Examiner* — Edward Tso
(74) *Attorney, Agent, or Firm* — Jones Day

(57) ABSTRACT

According to some embodiments of the present invention, a battery heating circuit includes a switch unit, a switching control module, a damping component, an energy storage circuit, and an energy superposition unit, wherein: the energy storage circuit is connected with the battery and includes a current storage component and a charge storage component; the damping component, the switch unit, the current storage component, and the charge storage component are connected in series; the switching control module is connected with the switch unit, and configured to control ON/OFF of the switch unit, so as to control the energy flowing between the battery and the energy storage circuit.

21 Claims, 9 Drawing Sheets

(56) References Cited

U.S. PATENT DOCUMENTS

| | | | |
|---|---|---|---|
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 | 8/2004 | Orr et al. | |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 | 8/2011 | Bucella et al. | |
| 8,197,502 B2 | 6/2012 | Smith et al. | |
| 8,493,036 B2 | 7/2013 | Ferrario | |
| 2005/0077879 A1 | 4/2005 | Near | |
| 2005/0156578 A1 | 7/2005 | Karmenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 * | 2/2012 | Xu et al. | 320/129 |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0161711 A1 | 6/2012 | Xu et al. | |
| 2012/0279951 A1 | 11/2012 | Xu et al. | |
| 2012/0280658 A1 * | 11/2012 | Xu et al. | 320/128 |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

China Patent Office, Office Action dated Jul. 27, 2011, in related application CN 201010603717.7.
China Patent Office, Office Action dated Jul. 27, 2011, in related application CN 201010604714.5.
China Patent Office, Office Action dated Sep. 5, 2011, in related application CN 201010606082.6.
China Patent Office, Office Action dated Sep. 21, 2011, in related application Cn 201010605772.X.
China Patent Office, Office Action dated Feb. 2, 2012, in related application CN 201010604777.0.
China Patent Office, Office Action dated Sep. 2, 2011, in related application CN 201010604777.0.
China Patent Office, Office Action dated Jan. 9, 2012, in related application CN 201010604729.1.
China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
China Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.
China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.

(56) References Cited

OTHER PUBLICATIONS

China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 2011 10134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
United States Patent and Trademark Office, Notice of Allowance mailed Dec. 5, 2013, in related U.S. Appl. No. 13/166,281.

(56) References Cited

OTHER PUBLICATIONS

United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Final Office Action Mailed Feb. 25, 2014, in related U.S. Appl. No. 13/170,021.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13,187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Office Action mailed Apr. 25, 2014, in related U.S. Appl. No. 13/166,281.
United States Patent and Trademark Office, Office Action mailed Jun. 24, 2014, in related U.S. Appl. No. 13/170,021.
United States Patent and Trademark Office, Office Action mailed Jun. 18, 2014, in related U.S. Appl. No. 13/189,096.
United States Patent and Trademark Office, Office Action mailed May 8, 2014, in related U.S. Appl. No. 13/187,874.
United States Patent and Trademark Office, Office Action mailed Apr. 28, 2014, in related U.S. Appl. No. 13/189,114.
United States Patent and Trademark Office, Office Action mailed May 22, 2014, in related U.S. Appl. No. 13/170,044.

* cited by examiner

US 8,816,647 B2

BATTERY HEATING CIRCUITS AND METHODS USING RESONANCE COMPONENTS IN SERIES BASED ON CURRENT LIMITING AND VOLTAGE INVERSION WITH BI-DIRECTIONALITY

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201010603471.3, filed Dec. 23, 2010, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

According to one embodiment, a battery heating circuit is provided, comprising a switch unit, a switching control module, a damping component R1, an energy storage circuit, an energy limiting circuit, and an energy control unit for energy storage circuit, wherein: the energy storage circuit is connected with the battery and comprises a current storage component L1 and a charge storage component C1; the damping component R1, the switch unit, the current storage component L1, and the charge storage component C1 are connected in series; the switching control module is connected with the switch unit, and is configured to control ON/OFF of the switch unit, so that the energy can flow back-and-forth between the battery and the energy storage circuit when the switch unit switches on; the energy limiting circuit is configured to limit the magnitude of current flowing from the energy storage circuit to the battery; the energy control unit for energy storage circuit is connected with the energy storage circuit and is configured to control the energy conversion in the energy storage circuit to a preset value after the switching control module controls the switch unit to switch on and then switch off.

According to some embodiments of the present invention, the heating circuit can improve the charge/discharge performance of the battery; in addition, for example, since the energy storage circuit is connected with the battery in series in the heating circuit, safety problem caused by over-current, which may result from failure and short circuit of the switch unit, can be avoided when the battery is heated due to the existence of the charge storage components C1 connected in series, and therefore the battery can be protected effectively.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
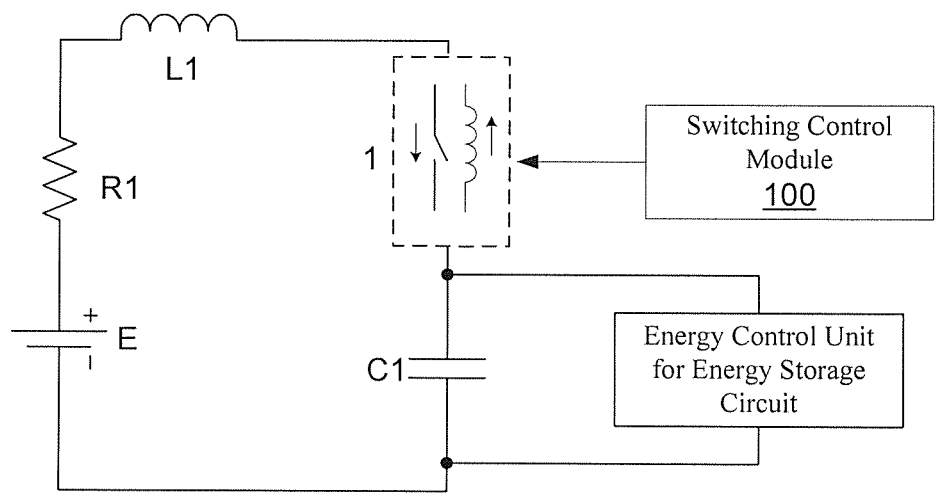
FIG. 1 is a schematic diagram showing a battery heating circuit according to one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

To heat up a battery E in low temperature environment, certain embodiments of the present invention provide a heating circuit for battery E. FIG. 1 is a schematic diagram showing a battery heating circuit according to one embodiment of the present invention. As shown in FIG. 1, for example, the battery heating circuit comprises a switch unit 1, a switching control module 100, a damping component R1, an energy storage circuit, an energy limiting circuit, and an energy control unit for energy storage circuit, wherein: the energy storage circuit is connected with the battery and comprises a current storage component L1 and a charge storage component C1; the damping component R1, switch unit 1, current storage component L1 and charge storage component C1 are connected in series; the switching control module 100 is connected with the switch unit 1, and is configured to control ON/OFF of the switch unit 1 so that the energy can flow back-and-forth between the battery and the energy storage circuit when the switch unit 1 switches on; the energy limiting circuit is configured to limit the magnitude of current flowing from the energy storage circuit to the battery; the energy control unit for energy storage circuit is connected with the energy storage circuit and is configured to control the energy conversion in the energy storage circuit to a preset value after the switching control module 100 controls the switch unit 1 to switch on and then switch off.

Considering different types of batteries E have different characteristics, if the resistance value of the parasitic resistor and the self-inductance of the parasitic inductor in the battery E are high, the damping component R1 can be the parasitic resistor in the battery and the current storage component L1 can be the parasitic inductor in the battery according to some embodiments.

In one embodiment, the switch unit 1 is connected in series with the energy storage circuit; when the switch unit 1 switches on, the energy can flows back-and-forth between the battery E and the energy storage circuit. For example, the switch unit 1 can be implemented in a variety of ways, and the present invention does not make any limitation to the implementation of the switch unit. In another example, the switch unit 1 comprise a first one-way branch configured to enable energy flow from the battery to the energy storage circuit and a second one-way branch configured to enable energy flow from the energy storage circuit to the battery; the switching control module 100 is connected to either or both of the first one-way branch and second one-way branch and is configured to control ON/OFF of the switch unit 1 by controlling ON/OFF of the connected branches. In yet another example, the energy limiting circuit comprises a current storage component L11; the current storage component L11 is connected in series in the second one-way branch and is used to limit the magnitude of the current flowing to the battery E.

Figure 2:
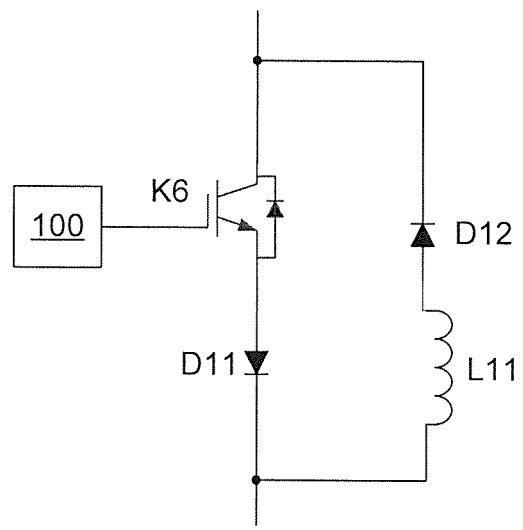
FIG. 2 is a schematic diagram showing the switch unit as shown in FIG. 1 according to one embodiment of the present invention.

FIG. 2 is a schematic diagram showing the switch unit 1 as shown in FIG. 1 according to one embodiment of the present invention. In one embodiment, as shown in FIG. 2, the switch unit 1 comprises a switch K6, a one-way semiconductor component D11, and a one-way semiconductor component D12, wherein: the switch K6 and the one-way semiconductor component D11 are connected in series with each other to form the first one-way branch; the one-way semiconductor component D12 forms the second one-way branch; the switching control module 100 is connected with the switch K6 to control ON/OFF of the first one-way branch by controlling ON/OFF of the switch K6. The current storage component L11 is, for example, connected in series with the one-way semiconductor component D12. In the switch unit 1 as shown in FIG. 2, when heating is needed, the switch K6 can be controlled to switch on; when heating is not needed, the switch K6 can be controlled to switch off according to some embodiments.

Figure 3:
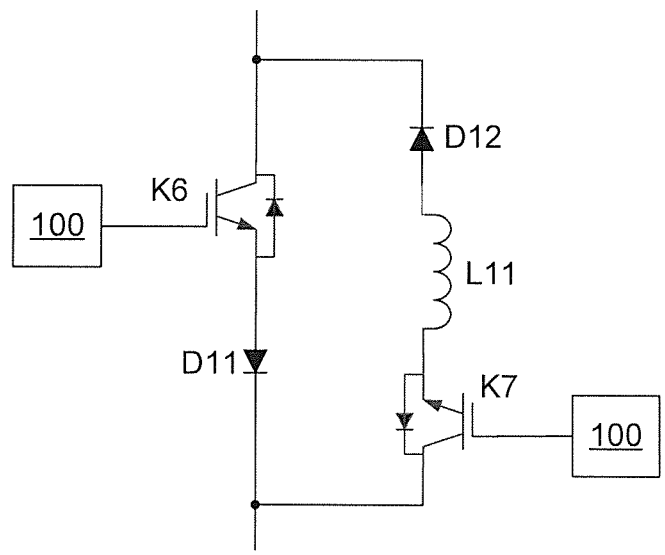
FIG. 3 is a schematic diagram showing the switch unit as shown in FIG. 1 according to another embodiment of the present invention.

Though the implementation of switch unit 1 as shown in FIG. 2 enables back-and-forth energy flow along separate branches, it may not enable cut-off function for energy flow in reverse direction according to certain embodiments. FIG. 3 is a schematic diagram showing the switch unit 1 as shown in FIG. 1 according to another embodiment of the present invention. As shown in FIG. 3, for example, the switch unit 1 further comprises a switch K7 in the second one-way branch, wherein: the switch K7 is connected with the one-way semiconductor component D12 in series, the switching control module 100 is also connected with the switch K7 and is configured to control ON/OFF of the second one-way branch by controlling ON/OFF of the switch K7. Thus, according to one embodiment, in the switch unit 1 as shown in FIG. 3, since there are switches (i.e., the switch K6 and the switch K7) in both one-way branches, the cut-off function for energy flow in the forward direction and in the reverse direction is enabled simultaneously. In another embodiment, the current storage component L11 is connected in series between the one-way semiconductor component D12 and the switch K7, and is used to limit the current flowing to the battery E.

According to the technical solution of the present invention, in some embodiments, when the battery E is to be heated up, the switching control module 100 controls the switch unit 1 to switch on, and thereby the battery E and the energy storage circuits are connected in series to form a loop, and the battery E charges the charge storage component C1; when the current of the loop reaches zero in forward direction after the peak current, the charge storage component C1 begins discharging and therefore the current flows from the charge storage component C1 back to the battery E; since both the current in forward direction and the current in reverse direction in the loop flow though the damping component R1, the purpose of heating up the battery E is achieved by using of the heat generation in the damping component R1. For example, the above charge/discharge process is carried out cyclically. In another example, when the temperature of the battery E rises to the heating stop condition, the switching control module 100 can control the switch unit 1 to switch off, and thereby the heating circuit will stop operating.

In the heating process described above, according to certain embodiments, when the current flows from the energy storage circuit back to the battery E, the energy in the charge storage component C1 will not flow back to the battery E completely; ultimately the voltage across the charge storage component C1 is close or equal to the voltage of the battery and therefore the energy does not flow from the battery E to the charge storage component C1 anymore; that phenomenon is adverse to the cyclic operation of the heating circuit. In view of that problem, according to some embodiments, the heating circuit provided in the present invention further comprises an energy control unit for energy storage circuit, which is configured to control energy in the energy storage circuit to be converted into a preset value when the switch unit 1 switches on and then switches off. For example, at an appropriate time, the switch unit 1 is controlled to switch off, and energy control unit for energy storage circuit is enabled to control the energy in the charge storage component C1. In another example, the switch unit 1 can be controlled to switch off at any time in one or more cycles; the switch unit 1 can be controlled to switch off at any time, for example, when the current in the loop is flowing in the forward direction/reverse direction or when the current in the loop is zero or not zero. According to some embodiments, a specific implementation of switch unit 1 can be selected, depending on the desired cut-off strategy; if the switch unit 1 can be controlled to switch off when the current is flowing in the forward direction as desired, the implementation of switch unit 1 as shown in FIG. 2 can be selected; if the switch unit 1 can be controlled to switch off when the current is either flowing in the forward direction or in the reverse direction as desired, the switch unit 1 which can enable the control of both branches in the forward direction and the reverse direction as shown in FIG. 3 can be selected. Preferably, for example, the switching control module 100 is configured to, after the switch unit 1 switches on, control the switch unit 1 to switch off when or after the current flowing though the switch unit 1 reaches zero, so as to improve the working efficiency of the loop. In addition, the disturbance to the entire circuit can be reduced if the switch unit 1 switches off with the current in the loop being zero.

Figure 4:
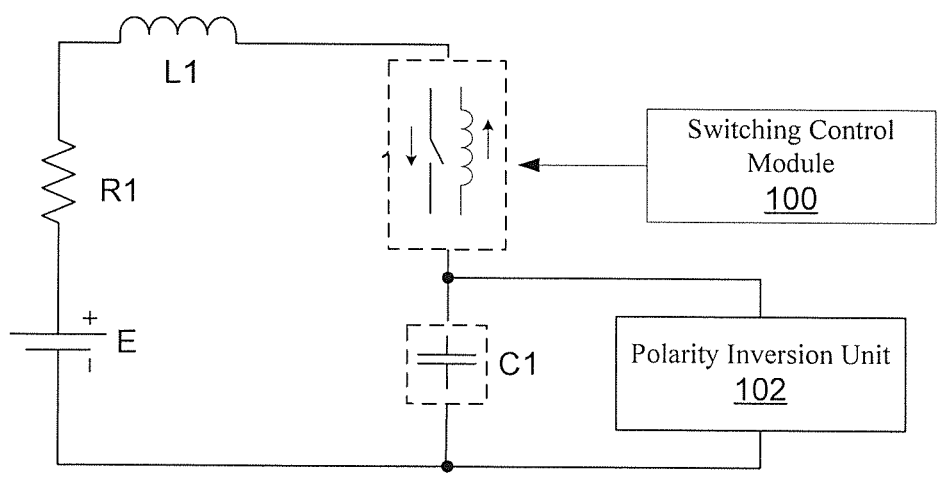
FIG. 4 is a schematic diagram showing a battery heating circuit that includes a polarity inversion unit as part of an energy control unit for energy storage circuit according to one embodiment of the present invention.

FIG. 4 is a schematic diagram showing a battery heating circuit that includes a polarity inversion unit as part of an energy control unit for energy storage circuit according to one embodiment of the present invention. As shown in FIG. 4, for example, the energy control unit for energy storage circuit in the heating circuit provided in the present invention comprises a polarity inversion unit 102, which is connected with the energy storage circuit, and is configured to invert the voltage polarity of the charge storage component C1 after the switch unit 1 switches on and then switches off, so that the polarity of the voltage of the charge storage component C1 and the polarity of the voltage of the battery E are in series for addition. Thus, in another embodiment, when the switch unit 1 switches on again, the energy in the charge storage component C1 after polarity inversion is superposed with the discharged energy from the battery E, and is again charged to the charge storage component C1 by the current flowing in the forward direction; hence, the energy in the charge storage component C1 is recycled and thereby the working efficiency of the heating circuit is improved.

Figure 5:
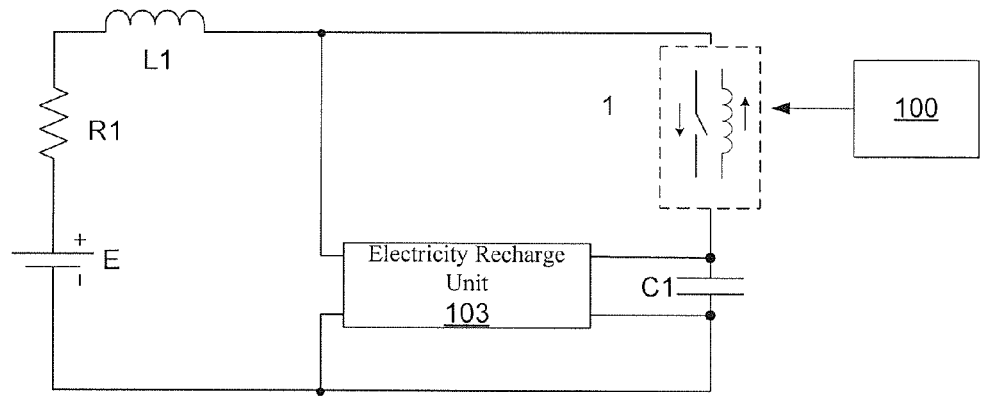
FIG. 5 is a schematic diagram showing a battery heating circuit that includes an electricity recharge unit as part of an energy control unit for energy storage circuit according to another embodiment of the present invention.

FIG. 5 is a schematic diagram showing a battery heating circuit that includes an electricity recharge unit as part of an energy control unit for energy storage circuit according to another embodiment of the present invention. As shown in FIG. 5, for example, the energy control unit for energy storage circuit in the heating circuit provided in the present invention comprises an electricity recharge unit 103, which is connected with the energy storage circuit and is configured to transfer the energy in the energy storage circuit to the battery E after the switch unit 1 switches on and then switches off. For example, the purpose of the electricity recharge unit 103 is to recycle the energy in the storage circuit.

Figure 6:
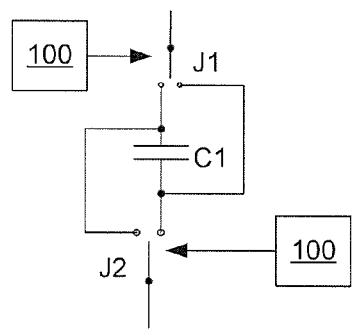
FIG. 6 is a schematic diagram showing the polarity inversion unit as part of the battery heating circuit as shown in FIG. 4 according to one embodiment of the present invention.

FIG. 6 is a schematic diagram showing the polarity inversion unit as part of the battery heating circuit as shown in FIG. 4 according to one embodiment of the present invention. As an embodiment of the polarity inversion unit 102, as shown in FIG. 6, the polarity inversion unit 102 comprises a single-pole double-throw switch J1 and a single-pole double-throw switch J2, which are located on the two ends of the charge storage component C1 respectively; the input wire of the single-pole double-throw switch J1 is connected within the energy storage circuit, the first output wire of the single-pole double-throw switch J1 is connected to the first pole plate of the charge storage component C1, and the second output wire of the single-pole double-throw switch J1 is connected to the second pole plate of the charge storage component C1; the input wire of the single-pole double-throw switch J2 is connected within the energy storage circuit, the first output wire of the single-pole double-throw switch J2 is connected to the second pole plate of the charge storage component C1, and the second output wire of the single-pole double-throw switch J2 is connected to the first pole plate of the charge storage component C1; the switching control module 100 is also connected to the single-pole double-throw switch J1 and the single-pole double-throw switch J2 separately and is configured to invert the voltage polarity of the charge storage component C1 by altering the connection relationships between the respective input wires and output wires of the single-pole double-throw switch J1 and the single-pole double-throw switch J2.

According to this embodiment, the connection relationships between the respective input wires and output wires of the single-pole double-throw switch J1 and the single-pole double-throw switch J2 can be set in advance, so that the input wire of the single-pole double-throw switch J1 is connected to the first output wire of the single-pole double-throw switch J1 and the input wire of the single-pole double-throw switch J2 is connected to the first output wire of the single-pole double-throw switch J2 when the switch unit K1 switches on; the input wire of the single-pole double-throw switch J1 is switched to connect with the second output wire of the single-pole double-throw switch J1 and the input wire of the single-pole double-throw switch J2 is switched to connect with the second output wire of the single-pole double-throw switch J2 under control of the switching control module 100 when the switch unit K1 switches off, and thereby the voltage polarity of the charge storage component C1 is inverted.

Figure 7:
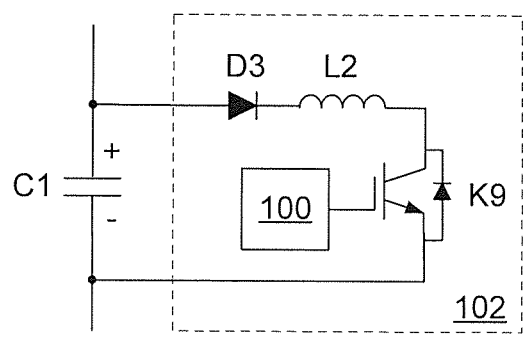
FIG. 7 is a schematic diagram showing the polarity inversion unit as part of the battery heating circuit as shown in FIG. 4 according to another embodiment of the present invention.

FIG. 7 is a schematic diagram showing the polarity inversion unit as part of the battery heating circuit as shown in FIG. 4 according to another embodiment of the present invention. As another embodiment of the polarity inversion unit 102, as shown in FIG. 7, the polarity inversion unit 102 comprises a one-way semiconductor component D3, a current storage component L2, and a switch K9; the charge storage component C1, the current storage component L2 and the switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9 and is configured to invert the voltage polarity of the charge storage component C1 by controlling the switch K9 to switch on.

According to the above embodiment, when the switch unit 1 switches off, the switch K9 can be controlled to switch on by the switching control module 100, and thereby the charge storage component C1, the one-way semiconductor component D3, the current storage component L2, and the switch K9 form an LC oscillation loop, and the charge storage component C1 discharges through the current storage component L2, thus, the voltage polarity of the charge storage component C1 is inverted when the current flowing through the current storage component L2 reaches zero after the current in the oscillation circuit flows through the positive half cycle.

Figure 8:
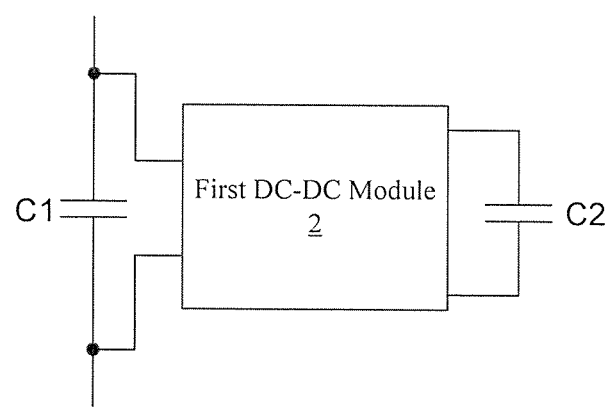
FIG. 8 is a schematic diagram showing the polarity inversion unit as part of the battery heating circuit as shown in FIG. 4 according to yet another embodiment of the present invention.

FIG. 8 is a schematic diagram showing the polarity inversion unit as part of the battery heating circuit as shown in FIG. 4 according to yet another embodiment of the present invention. As yet another embodiment of the polarity inversion unit 102, as shown in FIG. 8, the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2 and is configured to transfer the energy in the charge storage component C1 to the charge storage component C2 by controlling the operation of the first DC-DC module 2 and then transfer the energy in the charge storage component C2 back to the charge storage component C1, so as to invert the voltage polarity of the charge storage component C1.

For example, the first DC-DC module 2 is a DC-DC (direct current to direct current) conversion circuit for voltage polarity inversion commonly used in the field. In another example, the present invention does not impose any limitation on the specific circuit structure of the first DC-DC module 2, as long as the module can accomplish voltage polarity inversion of the charge storage component C1. Those skilled in the art can add, substitute, or delete the components in the circuit as needed.

Figure 9:
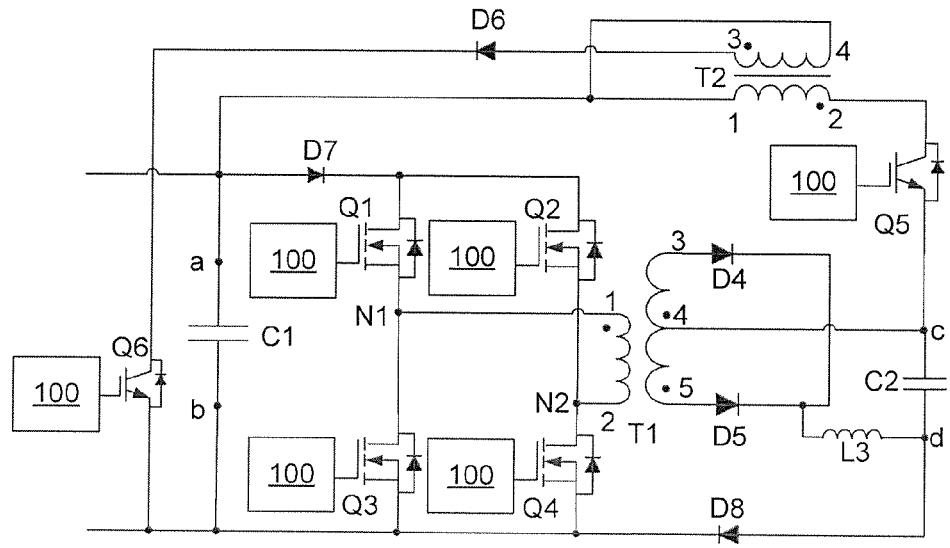
FIG. 9 is a schematic diagram showing the first DC-DC module as part of the polarity inversion unit for the battery heating circuit as shown in FIG. 8 according to one embodiment of the present invention.

FIG. 9 is a schematic diagram showing the first DC-DC module as part of the polarity inversion unit for the battery heating circuit as shown in FIG. 8 according to one embodiment of the present invention. As shown in FIG. 9, the first DC-DC module 2 comprises: a two-way switch Q1, a two-way switch Q2, a two-way switch Q3, a two-way switch Q4, a first transformer T1, a one-way semiconductor component D4, a one-way semiconductor component D5, a current storage component L3, a two-way switch Q5, a two-way switch Q6, a second transformer T2, a one-way semiconductor component D6, a one-way semiconductor component D7, and a one-way semiconductor component D8.

In this embodiment, the two-way switch Q1, the two-way switch Q2, the two-way switch Q3, and the two-way switch Q4 are MOSFETs, and the two-way switch Q5 and the two-way switch Q6 are IGBTs.

For example, the pins 1, 4 and 5 of the first transformer T1 are dotted terminals, and the pins 2 and 3 of the second transformer T2 are dotted terminals.

Wherein: in another example, the positive electrode of the one-way semiconductor component D7 is connected with the end 'a' of the charge storage component C1, and the negative electrode of the one-way semiconductor component D7 is connected with the drain electrodes of the two-way switch Q1 and the two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and the two-way switch Q4 are connected with the end 'b' of the charge storage component C1 respectively. Thus, in yet another example, a full-bridge circuit is formed, wherein: the voltage polarity of end 'a' of the charge storage component C1 is positive, while the voltage polarity of end 'b' of the charge storage component C1 is negative.

In yet another example, in the full-bridge circuit, the two-way switch Q1 and the two-way switch Q2 form the upper bridge arm, and the two-way switch Q3 and the two-way switch Q4 form the lower bridge arm. In yet another example, the full-bridge circuit is connected with the charge storage component C2 via the first transformer T1; the pin 1 of the first transformer T1 is connected with the first node N1, the pin 2 of the first transformer T1 is connected with the second node N2, and the pins 3 and 5 of the first transformer T1 are connected to the positive electrode of the one-way semiconductor component D4 and the positive electrode of the one-way semiconductor component D5 respectively; the negative electrode of the one-way semiconductor component D4 and the negative electrode of the one-way semiconductor component D5 are connected with one end of the current storage component L3, and the other end of the current storage component L3 is connected with the end 'd' of the charge storage component C2; the pin 4 of the transformer T1 is connected with the end 'c' of the charge storage component C2, the positive electrode of the one-way semiconductor component D8 is connected with the end 'd' of the charge storage component C2, and the negative electrode of the one-way semiconductor component D8 is connected with the end 'b' of the charge storage component C1; wherein: for example, the voltage polarity of end 'c' of the charge storage component C2 is negative, and the voltage polarity of end 'd' of the charge storage component C2 is positive.

Wherein: in yet another example, the end 'c' of the charge storage component C2 is connected with the emitter electrode of the two-way switch Q5, the collector electrode of the two-way switch Q5 is connected with the pin 2 of the transformer T2, the pin 1 of the transformer T2 is connected with end 'a' of the charge storage component C1, the pin 4 of the transformer T2 is connected with end 'a' of the charge storage component C1, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C2.

Wherein: in yet another embodiment, the two-way switch Q1, the two-way switch Q2, the two-way switch Q3, the two-way switch Q4, the two-way switch Q5, and the two-way switch Q6 are controlled by the switching control module 100 respectively to switch on and switch off.

According to certain embodiments, the working process of the first DC-DC module 2 is described below:

1. After the switch unit 1 switches off, the switching control module 100 controls the two-way switch Q5 and the two-way switch Q6 to switch off, and controls the two-way switch Q1 and the two-way switch Q4 to switch on at the same time to implement phase A; and controls the two-way switch Q2 and the two-way switch Q3 to switch on at the same time to implement phase B. Thus, by controlling the phase A and the phase B to switch on alternately, a full-bridge circuit is formed to operate;

2. When the full-bridge circuit operates, the energy in the charge storage component C1 is transferred through the first transformer T1, the one-way semiconductor component D4, the one-way semiconductor component D5, and the current storage component L3 to the charge storage component C2; now, the voltage polarity of end 'c' of the charge storage component C2 is negative, and the voltage polarity of end 'd' of the charge storage component C2 is positive; and 3. The switching control module 100 controls the two-way switch Q5 to switch on, and therefore a path from the charge storage component C1 to the charge storage component C2 is formed via the second transformer T2 and the one-way semiconductor component D8; thus, the energy in the charge storage component C2 is transferred back to the charge storage component C1, wherein: some energy is stored in the second transformer T2. Now, the switching control module 100 controls the two-way switch Q5 to switch off and controls the two-way switch Q6 to switch on; and therefore the energy stored in the second transformer T2 is transferred to the charge storage component C1 by the second transformer T2 and the one-way semiconductor component D6; now, the voltage polarity of the charge storage component C1 is inverted such that end 'a' is negative and end 'b' is positive. Thus, the purpose of inverting the voltage polarity of the charge storage component C1 is achieved.

Referring to FIG. 5, as an embodiment of the electricity recharge unit 103, the electricity recharge unit 103 comprises a second DC-DC module 3, which is connected with the charge storage component C1 and the battery E respectively; the switching control module 100 is also connected with the second DC-DC module 3 and is configured to control the operation of the second DC-DC module 3, so as to transfer the energy in the charge storage component C1 to the battery E.

For example, the second DC-DC module 3 is a DC-DC (direct current to direct current) conversion circuit for energy transfer commonly used in the field. In another example, the present invention does not impose any limitation on the specific circuit structure of the second DC-DC module 3, as long as the module can transfer the energy in the charge storage component C1. Those skilled in the art can add, substitute, or delete the components in the circuit as needed.

Figure 10:
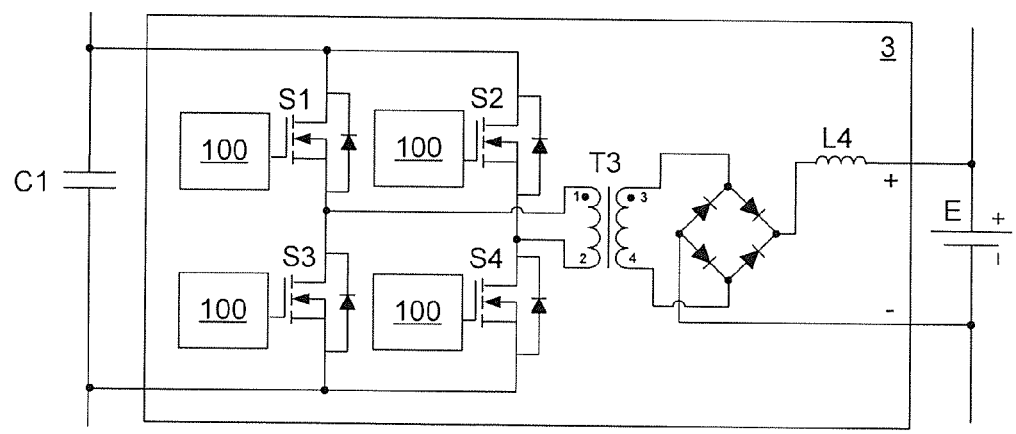
FIG. 10 is a schematic diagram showing a DC-DC module as part of the electricity recharge unit for the battery heating circuit as shown in FIG. 5 according to one embodiment of the present invention.

FIG. 10 is a schematic diagram showing a DC-DC module as part of the electricity recharge unit for the battery heating circuit as shown in FIG. 5 according to one embodiment of the present invention. As shown in FIG. 10, the second DC-DC module 3 comprises: a two-way switch S1, a two-way switch S2, a two-way switch S3, a two-way switch S4, a third transformer T3, a current storage component L4, and four one-way semiconductor components. In this embodiment, the two-way switch S1, the two-way switch S2, the two-way switch S3, and the two-way switch S4 are MOSFETs.

Wherein: for example, the pins 1 and 3 of the third transformer T3 are dotted terminals; the negative electrodes of two one-way semiconductor components among the four one-way semiconductor components are connected into a group and their connection point is connected with the positive pole of the battery E through the current storage component L4; the positive electrodes of the other two one-way semiconductor components are connected into a group and their connection point is connected with the negative pole of the battery E; in addition, the connection points between the groups are connected with the pins 3 and 4 of the third transformer T3 respectively, and thereby form a bridge rectifier circuit.

Wherein: in another example, the source electrode of the two-way switch S1 is connected with the drain electrode of the two-way switch S3, the source electrode of the two-way switch S2 is connected with the drain electrode of the two-way switch S4, the drain electrodes of the two-way switch S1 and the two-way switch S2 are connected with the positive end of the charge storage component C1 respectively, the source electrodes of the two-way switch S3 and the two-way switch S4 are connected with the negative end of the charge storage component C1 respectively; thus, a full-bridge circuit is formed.

In yet another example, in the full-bridge circuit, the two-way switch 51 and the two-way switch S2 form the upper bridge arm, and the two-way switch S3 and the two-way switch S4 form the lower bridge arm; the pin 1 of the third transformer T3 is connected with the node between two-way switch S1 and the two-way switch S3, and the pin 2 of the third transformer T3 is connected with the node between the two-way switch S2 and the two-way switch S4.

Wherein: in yet another example, the two-way switch 51, the two-way switch S2, the two-way switch S3, and the two-way switch S4 are controlled by the switching control module 100 respectively to switch on and switch off.

According to certain embodiments, the working process of the second DC-DC module 3 is described below:

1. After the switch unit 1 switches off, the switching control module 100 controls the two-way switch 51 and the two-way switch S4 to switch on at the same time to implement phase A; and controls the two-way switch S2 and two-way switch S3 to switch on at the same time to implement phase B. Thus, by controlling the phase A and the phase B to switch on alternately, a full-bridge circuit is formed to operate; and 2. When the full-bridge circuit operates, the energy in charge storage component C1 is transferred to the battery E through the third transformer T3 and the rectifier circuit; and the rectifier circuit converts the AC input into DC and outputs the DC to the battery E, to achieve the purpose of electricity recharge.

Figure 11:
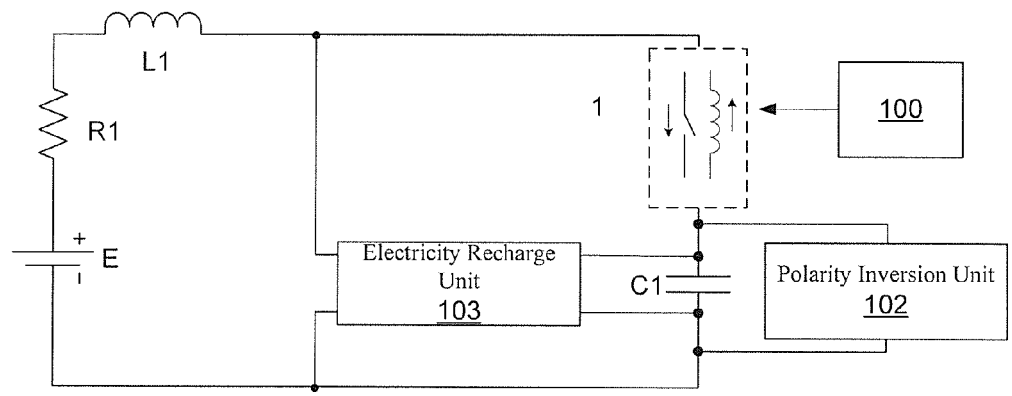
FIG. 11 is a schematic diagram showing a battery heating circuit that includes a polarity inversion unit and an electricity recharge unit as parts of an energy control unit for energy storage circuit according to yet another embodiment of the present invention.

FIG. 11 is a schematic diagram showing a battery heating circuit that includes a polarity inversion unit and an electricity recharge unit as parts of an energy control unit for energy storage circuit according to yet another embodiment of the present invention. As shown in FIG. 11, the energy control unit for energy storage circuit comprises the polarity inversion unit 102 and the electricity recharge unit 103 described above; after the switch unit 1 switches off, the electricity recharge unit 103 transfers the energy in the charge storage component C1 to the battery E first, and then the polarity inversion unit 102 inverts voltage polarity of the charge storage component C1 according to some embodiments.

Figure 12:
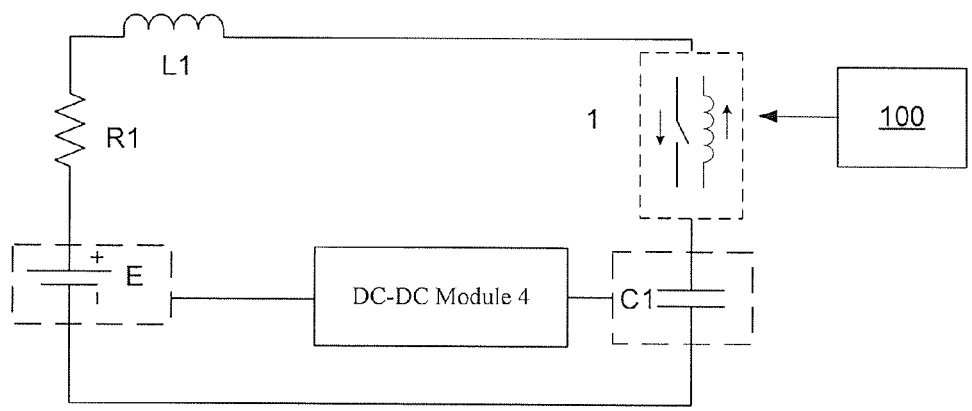
FIG. 12 is a schematic diagram showing the energy control unit for energy storage circuit as part of the battery heating circuit as shown in FIG. 1 according to yet another embodiment of the present invention.

FIG. 12 is a schematic diagram showing the energy control unit for energy storage circuit as part of the battery heating circuit as shown in FIG. 1 according to yet another embodiment of the present invention. As shown in FIG. 12, the energy control unit for energy storage circuit comprises a DC-DC module 4, which is connected with the charge storage component C1 and the battery E separately; the switching control module 100 is also connected to the DC-DC module 4 and is configured to transfer the energy in the charge storage component C1 to an energy storage component by controlling the operation of the DC-DC module 4 after the switch unit 1 switches on and then switches off, and then superpose the remaining energy in the charge storage component C1 with the energy in the battery E.

For example, the DC-DC module 4 is a DC-DC (direct current to direct current) conversion circuit for energy transfer and voltage polarity inversion commonly used in the field. In another example, the present invention does not impose any limitation to the specific circuit structure of the DC-DC module 4, as long as the module can accomplish energy transfer from the charge storage component C1 and voltage polarity inversion of the charge storage component C1. Those skilled in the art can add, substitute, or delete the components in the circuit as needed.

Figure 13:
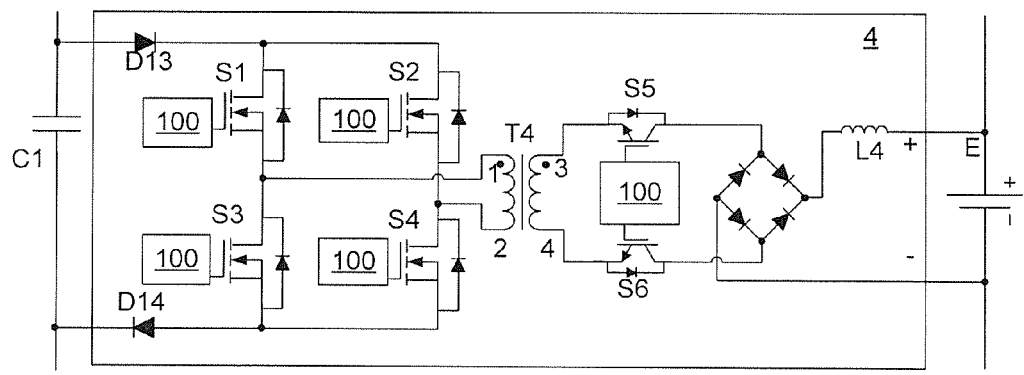
FIG. 13 is a schematic diagram showing a DC-DC module as part of the electricity recharge unit for the battery heating circuit according to another embodiment of the present invention.

FIG. 13 is a schematic diagram showing a DC-DC module as part of the electricity recharge unit for the battery heating circuit according to another embodiment of the present invention. As shown in FIG. 13, the DC-DC module 4 comprises: a two-way switch S1, a two-way switch S2, a two-way switch S3, a two-way switch S4, a two-way switch S5, a two-way switch S6, a fourth transformer T4, a one-way semiconductor component D13, a one-way semiconductor component D14, a current storage component L4, and four one-way semiconductor components. In this embodiment, the two-way switch S1, the two-way switch S2, the two-way switch S3, and the two-way switch S4 are MOSFETs, and the two-way switch S5 and the two-way switch S6 are IGBTs.

Wherein: for example, the pin 1 and the pin 3 of the fourth transformer T4 are dotted terminals; the negative electrodes of two one-way semiconductor components among the four one-way semiconductor components are connected into a group and their connection point is connected with the positive pole of the battery E through the current storage component L4; the positive electrodes of the other two one-way semiconductor components are connected into a group and their connection point is connected with the negative pole of the battery E; in addition, the connection points between the groups are connected with the pin 3 and the pin 4 of the fourth transformer T4 via the two-way switch S5 and the two-way switch S6 respectively, and thereby form a bridge rectifier circuit.

Wherein: in another example, the source electrode of the two-way switch S1 is connected with the drain electrode of the two-way switch S3, and the source electrode of the two-way switch S2 is connected with the drain electrode of the two-way switch S4; the drain electrodes of the two-way switch S1 and the two-way switch S2 are connected with the positive end of the charge storage component C1 via the one-way semiconductor component D13, and the source electrodes of the two-way switch S3 and the two-way switch S4 are connected with the negative end of the charge storage component C1 via the one-way semiconductor component D14; thus, a full-bridge circuit is formed.

In yet another example, in the full-bridge circuit, the two-way switch S1 and the two-way switch S2 form the upper bridge arm, and the two-way switch S3 and the two-way switch S4 form the lower bridge arm; the pin 1 of the fourth transformer T4 is connected with the node between the two-way switch S1 and the two-way switch S3, and the pin 2 of the fourth transformer T4 is connected with the node between the two-way switch S2 and the two-way switch S4.

Wherein: in yet another example, the two-way switch S1, the two-way switch S2, the two-way switch S3, the two-way switch S4, the two-way switch S5, and two-way switch S6 are controlled by the switching control module 100 individually to switch on and switch off.

According to certain embodiments, the working process of the DC-DC module 4 is described below:

1. After the switch unit 1 switches off, when electricity recharging is to be performed from the charge storage component C1 (i.e., transferring the energy from the charge storage component C1 back to the battery E) so as to achieve energy transfer, the switching control module 100 controls the two-way switches S5 and S6 to switch on, controls the two-way switch S1 and the two-way switch S4 to switch on at the same time to implement phase A; the switching control module 100 controls the two-way switches S2 and the two-way switch S3 to switch on at the same time to implement phase B. Thus, by controlling the phase A and the phase B to switch on alternately, a full-bridge circuit is formed to operate;

2. When the full-bridge circuit operates, the energy in charge storage component C1 is transferred to the battery E through the fourth transformer T4 and the rectifier circuit; the rectifier circuit converts the AC input into DC and outputs the DC to the battery E to achieve the purpose of electricity recharging; and 3. When polarity inversion of the charge storage component C1 is to be performed to accomplish energy superposition, the switching control module 100 controls the two-way switch S5 and the two-way switch S6 to switch off, and controls either of the two groups (the two-way switch S1 and the two-way switch S4, or the two-way switch S2 and the two-way switch S3) to switch on; now, the energy in the charge storage component C1 flows through the positive end of charge storage component C1, the two-way switch S1, the primary side of the fourth transformer T4, and the two-way switch S4 back to the negative end of the charge storage component C1, or flows through the positive end of charge storage component C1, the two-way switch S2, the primary side of the fourth transformer T4, and the two-way switch S3 back to the negative end of the charge storage component C1. Thus, the purpose of voltage polarity inversion of charge storage component C1 is achieved by using the magnetizing inductance at the primary side of T4.

According to certain embodiments, the switching control module 100 can be a separate controller, which, by using internal program setting, enables ON/OFF control of different external switches; or, the switching control module 100 can be a plurality of controllers. For example, each external switch corresponds to one switching control module 100. In another example, a plurality of switching control modules 100 is integrated into an assembly. In yet another example, the present invention does not impose any limitation on implementation of the switching control module 100.

According to some embodiments, the working process of the heating circuit for battery E are briefly described below with reference to FIGS. 14-16. For example, it should be noted that, though certain features and components of the present invention are described specifically with reference to FIG. 14 and FIG. 16, each feature or component can be used separately without other features and components or can be used in combination or not in combination with other features and components. In another example, the embodiments of the heating circuit for battery E provided in the present invention are not limited to those shown in FIGS. 14 and 16. In yet another example, FIG. 15 shows the waveforms corresponding to the embodiment as shown in FIG. 14; the grid part of the waveforms indicates multiple drive pulses can be applied to the switch within the period and the pulse width can be adjusted as needed.

Figure 14:
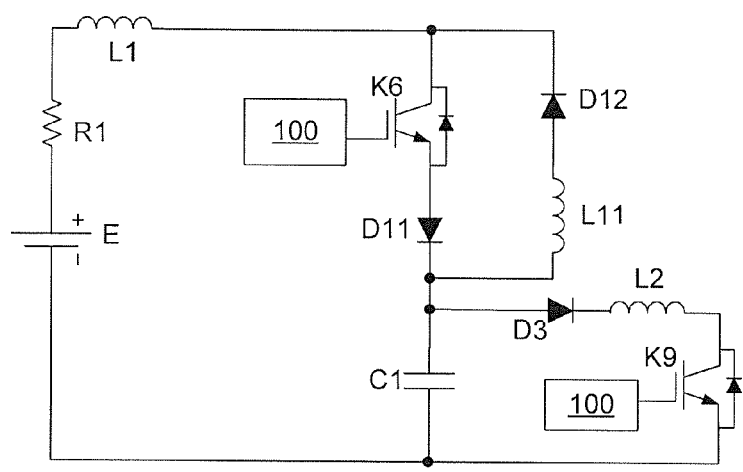
FIG. 14 is a schematic diagram showing a battery heating circuit according to another embodiment of the present invention.

FIG. 14 is a schematic diagram showing a battery heating circuit according to another embodiment of the present invention. In the heating circuit for battery E as shown in FIG. 14, for example, the switch K6 and the one-way semiconductor component D11 are connected in series to constitute a first one-way branch of the switch unit 1; the one-way semiconductor component D12 constitutes the second one-way branch of the switch unit 1, and the current storage component L11 is arranged in the second one-way branch as an energy limiting circuit and is connected in series with the one-way semiconductor component D12; the one-way semiconductor component D3, the current storage component L2, and the switch K9 constitute the polarity inversion unit 102; the switching control module 100 can control ON/OFF of the switch K9 and the switch K6.

Figure 15:
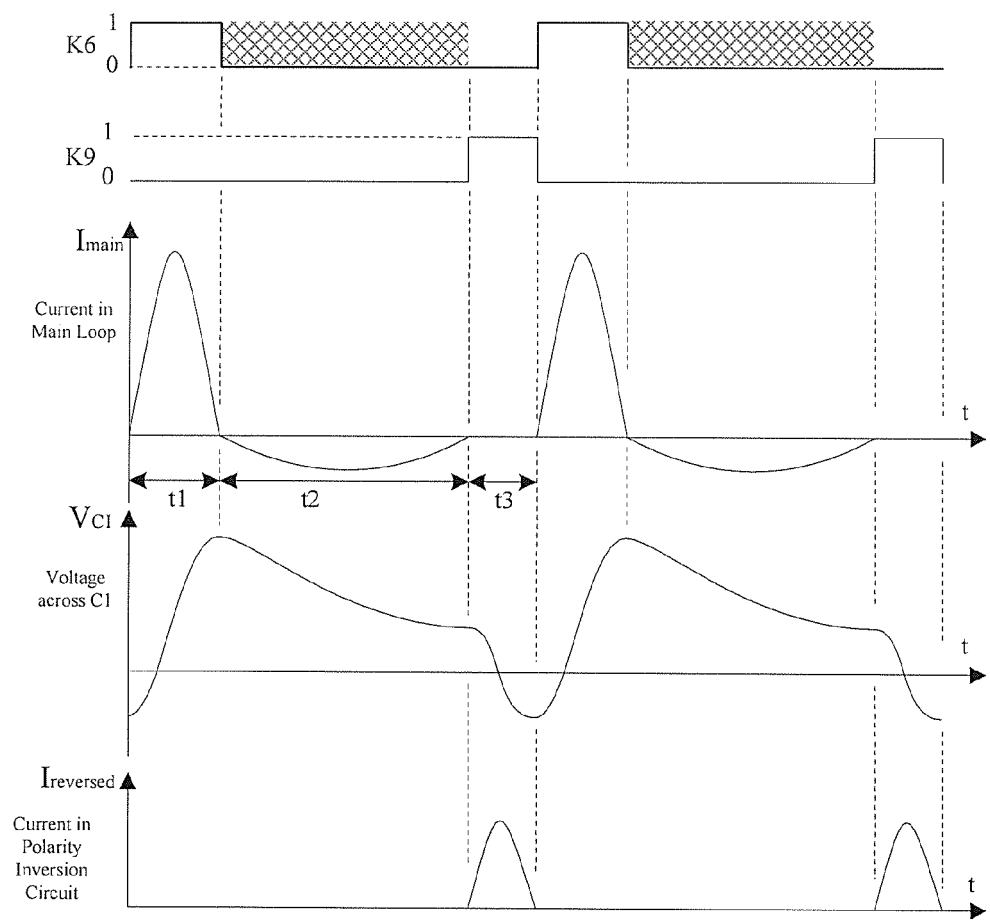
FIG. 15 is a timing diagram of waveforms of the battery heating circuit as shown in FIG. 14 according to one embodiment of the present invention.

FIG. 15 is a timing diagram of waveforms of the battery heating circuit as shown in FIG. 14 according to one embodiment of the present invention. For example, FIG. 15 shows the waveform of the current $I_{main}$ in the main loop of the heating circuit as shown in FIG. 14, the waveform of the voltage $V_{C1}$ across C1, and the waveform of the current $I_{L2}$ in the polarity inversion loop. In another example, the working process of the heating circuit as shown in FIG. 14 is as follows:

a) The switching control module 100 controls the switch K6 to switch on, and thus the battery E is discharged in forward direction through the switch K6, the one-way semiconductor component D11 and the storage component C1 (as indicated by the time duration t1 as shown in FIG. 15), and is charged in reverse direction through the current storage component L11 and the one-way semiconductor component D12 (as indicated by the time duration t2 as shown in FIG. 15). As shown by the time duration t2 of FIG. 15 that, due to existence of the current storage component L11, the current in the main loop is limited to a smaller value when the battery is charged;

b) The switching control module 100 controls the switch K6 to switch off when the current in reverse direction is zero;

c) The switching control module 100 controls the switch K9 to switch on, and therefore the polarity inversion unit 102 starts to operate: the charge storage component C1 is discharged through the loop composed by the one-way semiconductor component D3, the current storage component L2 and the switch K9, to achieve the purpose of voltage polarity inversion. Then, the switching control module 100 controls the switch K9 to switch off, as indicated by the time duration t3 of FIG. 15.

d) Repeating step a) through step c), the battery E is heated up continuously while it is discharged and charged, till the battery E meets the heating stop condition.

Figure 16:
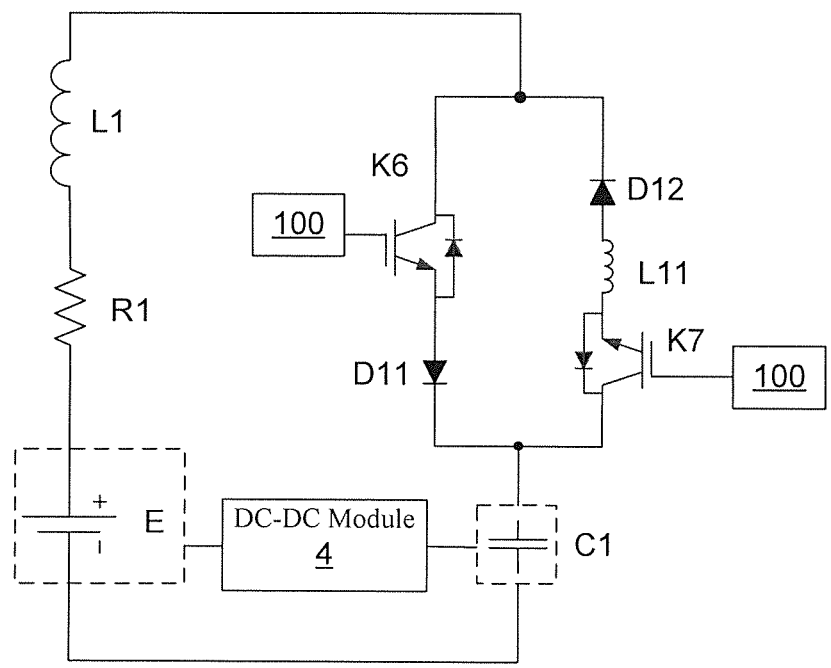
FIG. 16 is a schematic diagram showing a battery heating circuit according to yet another embodiment of the present invention.

FIG. 16 is a schematic diagram showing a battery heating circuit according to yet another embodiment of the present invention. In the heating circuit for battery E as shown in FIG. 16, for example, the switch K6 and the one-way semiconductor component D11 are connected to each other in series (the first one-way branch), and the switch K7 and the one-way semiconductor component D12 connected to each other in series (the second one-way branch) constitute the switch unit 1; the current storage component L11 serves as the energy limiting circuit and is connected in series between the switch K7 and the one-way semiconductor component D12; the DC-DC module 4 constitutes an energy control unit for energy storage circuit, which transfers the energy in the charge storage component C1 back to the battery E and then inverts the voltage polarity of the charge storage component C1 so that the energy in the charge storage component C1 can be superposed with the energy in the battery E in the next charge/discharge cycle; the switching control module 100 can control ON/OFF of the switch K6 and the switch K7 and control whether the DC-DC module 4 operates or not. In another example, the working process of the heating circuit as shown in FIG. 16 is as follows:

a) The switching control module 100 controls the switch K6 and the switch K7 to switch on, and thus the battery E is discharged in forward direction through the switch K6, the one-way semiconductor component D11 and the storage component C1, and is charged in reverse direction through the charge storage component C1, switch K7, and one-way semiconductor component D12. Due to the existence of the current storage component L11, the current in the main loop is limited to a smaller value when the battery E is charged;

b) The switching control module 100 controls the switch K6 and the switch K7 to switch off when the current in reverse direction is zero;

c) The switching control module 100 controls the DC-DC module 4 to start operating: via the DC-DC module 4, the charge storage component C1 converts the AC current into DC current and outputs the DC current to the battery E to achieve electricity recharging; then, the DC-DC module 4 inverts the voltage polarity of the charge storage component C1. After the polarity inversion of C1 is inverted, the switching control module 100 controls the DC-DC module 4 to stop operating;

d) Repeating step a) through step c), the battery E is heated up continuously while it is discharged and charged, till the battery E meets the heating stop condition.

Using the heating circuit provided in certain embodiments of the present invention, safety problem related with short circuit caused by failures of the switch unit 1 can be avoided when the battery E is heated due to the existence of the charge storage component C1 connected in series and therefore the battery E can be protected effectively.

According to one embodiment, a battery heating circuit comprises a switch unit 1, a switching control module 100, a damping component R1, an energy storage circuit, an energy limiting circuit, and an energy control unit for energy storage circuit. The energy storage circuit is connected with the battery and comprises a current storage component L1 and a charge storage component C1. The damping component R1, the switch unit 1, the current storage component L1, and the charge storage component C1 are connected in series. The switching control module 100 is connected with the switch unit 1 and is configured to control ON/OFF of the switch unit (1), so that the energy can flow back-and-forth between the battery and the energy storage circuit when the switch unit (1) is switched on. The energy limiting circuit is configured to limit the magnitude of current flowing from the energy storage circuit to the battery. The energy control unit for energy storage circuit is connected to the energy storage circuit and is configured to control the energy conversion in the energy storage circuit to a preset value after the switching control module 100 controls the switch unit 1 to switch on and then switch off.

For example, wherein: the damping component R1 is the parasitic resistance in the battery, and the current storage component L1 is the parasitic inductance in the battery. In another example, wherein: the switch unit 1 comprises a first one-way branch configured to enable energy flow from the battery to the energy storage circuit and a second one-way branch configured to enable energy flow from the energy storage circuit to the battery. The switching control module 100 is connected to either or both of the first one-way branch and the second one-way branch and is configured to control ON/OFF of the switch unit 1 by controlling ON/OFF of the connected branch(es).

In another example, wherein: the energy limiting circuit comprises a current storage component L11 connected in series in the second one-way branch. In yet another example, wherein: the switch unit 1 comprises a switch K6, a one-way semiconductor component D11, and a one-way semiconductor component D12. The switch K6 and the one-way semiconductor component D11 are connected with each other in series to form the first one-way branch, and the one-way semiconductor component D12 forms the second one-way branch. The switching control module (100) is connected to the switch K6 and is configured to control ON/OFF of the first one-way branch by controlling ON/OFF of the switch K6, and the current storage component L11 is connected in series with the one-way semiconductor component D12. In yet another example, wherein: the switch unit 1 further comprises a switch K7, and the switch K7 is connected with the one-way semiconductor component D12 in series in the second one-way branch. The switching control module 100 is further connected with the switch K7 and is configured to control ON/OFF of the second one-way branch by controlling ON/OFF of the switch K7, and the current storage component L11 is connected in series between the one-way semiconductor component D12 and the switch K7.

In yet another example, wherein: the energy control unit for energy storage circuit comprises a polarity inversion unit (102), which is connected with the energy storage circuit and is configured to invert the voltage polarity of the charge storage component C1 after the switch unit (1) switches on and then switches off. In yet another example, wherein: the energy control unit for energy storage circuit further comprises an electricity recharge unit 103, which is connected with the energy storage circuit and is configured to transfer the energy in the energy storage circuit to the battery after the switch unit 1 switches on and then switches off and before the polarity inversion unit 102 inverts the voltage polarity of the charge storage component C1. In yet another example, wherein: the polarity inversion unit 102 comprises a single-pole double-throw switch J1 and a single-pole double-throw switch J2 located at the two ends of the charge storage component C1 respectively. The input wire of the single-pole double-throw switch J1 is connected within the energy storage circuit, the first output wire of the single-pole double-throw switch J1 is connected with the first pole plate of the charge storage component C1, and the second output wire of the single-pole double-throw switch J1 is connected with the second pole plate of the charge storage component C1. The input wire of the single-pole double-throw switch J2 is connected within the energy storage circuit, the first output wire of the single-pole double-throw switch J2 is connected with the second pole plate of the charge storage component C1, and the second output wire of the single-pole double-throw switch J2 is connected with the first pole plate of the charge storage component C1. The switching control module 100 is also connected with the single-pole double-throw switch J1 and the single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2. In yet another example, the polarity inversion unit 102 comprises a one-way semiconductor component D3, a current storage component L2, and a switch K9. The charge storage component C1, the current storage component L2, and the switch K9 are connected sequentially in series to form a loop, and the one-way semiconductor component D3 is connected in series between the charge storage component C1 and the current storage component L2 or between the current storage component L2 and the switch K9. The switching control module 100 is also connected with the switch K9 and is configured to invert the voltage polarity of the charge storage component C1 by controlling the switch K9 to switch on. In yet another example, wherein: the polarity inversion unit 102 comprises a first DC-DC module 2 and a charge storage component C2. The first DC-DC module 2 is connected with the charge storage component C1 and the charge storage component C2 separately. The switching control module 100 is also connected with the first DC-DC module 2 and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

In yet another example, wherein: the energy control unit for energy storage circuit further comprises an electricity recharge unit 103, which is connected with the energy storage circuit and is configured to transfer the energy in the energy storage circuit to the battery after the switch unit (1) switches on and then switches off. In yet another example, wherein: the electricity recharge unit 103 comprises a second DC-DC module 3, which is connected with the charge storage component C1 and the battery separately. The switching control module 100 is also connected with the second DC-DC module 3 and is configured to transfer the energy in the charge storage component C1 to the battery by controlling the operation of the second DC-DC module 3.

In yet another example, wherein: the energy control unit for energy storage circuit further comprises a DC-DC module 4, which is connected with the charge storage component C1 and the battery separately. The switching control module 100 is also connected with the DC-DC module 4 and is configured to control the operation of the DC-DC module 4 to transfer the energy in the charge storage component C1 to an energy storage component, and then superpose the remaining energy in the charge storage component C1 with the energy in the battery after the switch unit 1 switches on and then switches off.

In yet another example, wherein: the switching control module 100 is configured to control the switch unit 1 to switch off when or after the current flowing through the switch unit 1 reaches zero after the switch unit 1 switches on.

Certain embodiments of the present invention provide a battery heating circuit, comprising a switch unit 1, a switching control module 100, a damping component R1, an energy storage circuit, an energy limiting circuit, and an energy control unit for energy storage circuit, wherein: the energy storage circuit is connected with the battery and comprises a current storage component L1 and a charge storage component C1; the damping component R1, the switch unit 1, the current storage component L1, and the charge storage component C1 are connected in series; the switching control module 100 is connected with the switch unit 1, and is configured to control ON/OFF of the switch unit 1, so that the energy can flow back-and-forth between the battery and the energy storage circuit when the switch unit 1 switches on; the energy limiting circuit is configured to limit the magnitude of current flowing from the energy storage circuit to the battery; the energy control unit for energy storage circuit is connected with the energy storage circuit, and is configured to control the energy conversion in the energy storage circuit to a preset value after the switching control module 100 controls the switch unit 1 to switch on and then switch off. Using the heating circuit provided in some embodiments of the present invention, safety problem caused by over-current in the heating loop can be avoided, and therefore the battery can be protected effectively.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A circuit for heating a battery, the circuit comprising:
the battery including a first damping component and a first current storage component, the first damping component and the first current storage component being parasitic to the battery;
a switch unit;
a switching control module coupled to the switch unit;
a first charge storage component, the first charge storage component and the first current storage component being at least parts of an energy storage circuit;
an energy limiting circuit coupled to the switch unit; and
an energy control unit coupled to the first charge storage component;
wherein the circuit for heating the battery is configured to heat the battery by at least discharging the battery and charging the battery;
wherein:
the first damping component, the first current storage component, the switch unit, and the first charge storage component are connected in series;
the switching control module is configured to turn on the switch unit and allow a current to flow back-and-forth between the battery and the first charge storage component;

the energy limiting circuit is configured to limit the current flowing from the first charge storage component to the battery; and the energy control unit is configured to control energy stored in the first charge storage component after the switch unit is turned on and then turned off.

2. The circuit of claim 1 is further configured to:
start heating the battery if at least one heating start condition is satisfied; and
stop heating the battery if at least one heating stop condition is satisfied.

3. A circuit for heating a battery, the circuit comprising:
the battery including a first damping component and a first current storage component, the first damping component and the first current storage component being parasitic to the battery;
a switch unit coupled to the battery and including a first switch;
a first charge storage component coupled to the battery;
an energy control unit coupled to the first charge storage component; and
a switching control module coupled to the switch unit and the energy control unit;
wherein the circuit for heating the battery is configured to heat the battery by at least discharging the battery and charging the battery;
wherein the switching control module is configured to:
turn on the first switch, for at least a first period of time, to discharge the battery and charge the first charge storage component, with a first current, through at least the first switch; and
allow discharging the first charge storage component and charging the battery with a second current for at least a second period of time, the second period of time being after the first period of time;
wherein the energy control unit is configured to adjust a storage voltage associated with the first charge storage component during a third period of time, the third period of time being after the second period of time.

4. The circuit of claim 3 wherein the switching control module is further configured to turn on and off the first switch for one or more times during the second period of time.

5. The circuit of claim 3 wherein the switching control module is further configured to, if the second current decreases to a predetermined threshold in magnitude, adjust the storage voltage associated with the first charge storage component during the third period of time.

6. The circuit of claim 5 wherein the switching control module is further configured to turn off the first switch for at least the third period of time.

7. The circuit of claim 5 wherein the switching control module is further configured to, if the second current decreases to the predetermined threshold in magnitude, change a polarity of the storage voltage during the third period of time.

8. The circuit of claim 7 wherein the predetermined threshold is equal to zero.

9. The circuit of claim 3 wherein the energy control unit is further configured to change a polarity of the storage voltage associated with the first charge storage component during a fourth period of time, the fourth period of time being at least a part of the third period of time.

10. The circuit of claim 9 wherein the energy control unit is further coupled to the battery and further configured to transfer, without going through the switch unit, an amount of energy from the first charge storage component to the battery during a fifth period of time, the fifth period of time being after the fourth period of time and being at least a part of the third period of time.

11. The circuit of claim 3 wherein the energy control unit is further coupled to the battery and further configured to transfer, without going through the switch unit, an amount of energy from the first charge storage component to the battery during a fourth period of time, the fourth period of time being at least a part of the third period of time.

12. The circuit of claim 3 wherein:
the first damping component includes a parasitic resistor of the battery; and
the first current storage component includes a parasitic inductor of the battery.

13. The circuit of claim 3 wherein:
the switch unit further includes a first branch circuit for conduction in a first direction and a second branch circuit for conduction in a second direction, the first direction being from the battery to the first charge storage component, the second direction being from the first charge storage component to the battery;
wherein the first branch circuit includes the first switch and configured to, if turned on, allow discharging the battery and charging the first charge storage component.

14. The circuit of claim 13 and further comprising a second current storage component connected in series with the second branch circuit and configured to limit the second current flowing from the first charge storage component to the battery through the second branch circuit.

15. The circuit of claim 14 wherein:
the first branch circuit further includes a first one-way semiconductor component; and
the second branch circuit includes a second one-way semiconductor component connected in series with the second current storage component.

16. The circuit of claim 15 wherein:
the second branch circuit further includes a second switch in series with the second one-way semiconductor component and the second current storage component; and
the switching control module is further configured to turn on the second switch to discharge the first charge storage component and charge the battery during the second period of time.

17. A circuit for heating a battery, the circuit comprising:
the battery including a first resistor and a first inductor, the first resistor and the first inductor being parasitic to the battery;
a switch unit coupled to the battery and including a first switch;
a first capacitor coupled to the battery;
an energy control unit coupled to the first capacitor; and
a switching control module coupled to the switch unit and the energy control unit;
wherein the circuit for heating the battery is configured to heat the battery by at least discharging the battery and charging the battery;
wherein the switching control module is configured to:
turn on the first switch, for at least a first period of time, to discharge the battery and charge the first capacitor, with a first current, through at least the first switch; and
allow discharging the first capacitor and charging the battery with a second current for at least a second period of time, the second period of time being after the first period of time;
wherein the energy control unit is configured to adjust a capacitor voltage associated with the first capacitor during a third period of time, the third period of time being after the second period of time.

18. The circuit of claim 17 wherein:
the switch unit further includes a first branch circuit for conduction in a first direction and a second branch circuit for conduction in a second direction, the first direction being from the battery to the first capacitor, the second direction being from the first capacitor to the battery;
wherein the first branch circuit includes the first switch and configured to, if turned on, allow discharging the battery and charging the first capacitor.

19. The circuit of claim 18 and further comprising a second inductor connected in series with the second branch circuit and configured to limit the second current flowing from the first capacitor to the battery through the second branch circuit.

20. The circuit of claim 19 wherein:
the first branch circuit further includes a first diode; and
the second branch circuit includes a second diode connected in series with the second inductor.

21. The circuit of claim 20 wherein:
the second branch circuit further includes a second switch in series with the second diode and the second inductor; and
the switching control module is further configured to turn on the second switch to discharge the first capacitor and charge the battery during the second period of time.

* * * * *